(12) United States Patent
Kim et al.

(10) Patent No.: US 12,283,830 B2
(45) Date of Patent: Apr. 22, 2025

(54) ELECTRONIC DEVICE HAVING WIRELESS CHARGING FUNCTION AND CONTROL METHOD THEREOF

(71) Applicant: Samsung Electronics Co., Ltd., Gyeonggi-do (KR)

(72) Inventors: Junyoung Kim, Gyeonggi-do (KR); Minyoung Lee, Gyeonggi-do (KR); Johngy Lee, Gyeonggi-do (KR); Jungki Choi, Gyeonggi-do (KR); Jaeyoung Huh, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 558 days.

(21) Appl. No.: 17/585,935

(22) Filed: Jan. 27, 2022

(65) Prior Publication Data

US 2022/0149669 A1  May 12, 2022

Related U.S. Application Data

(63) Continuation of application No. PCT/KR2020/010430, filed on Aug. 6, 2020.

(30) Foreign Application Priority Data

Aug. 6, 2019 (KR) .......................... 10-2019-0095782

(51) Int. Cl.
*H02J 50/70* (2016.01)
*H02J 7/02* (2016.01)
(Continued)

(52) U.S. Cl.
CPC ................ *H02J 50/70* (2016.02); *H02J 7/02* (2013.01); *H02J 50/005* (2020.01); *H02J 50/10* (2016.02);
(Continued)

(58) Field of Classification Search
CPC .......... H02J 50/70; H02J 50/10; H02J 50/005; H02J 7/02; H05K 1/0216; H05K 1/0277; H05K 1/14; H05K 5/0017; H05K 7/1427
(Continued)

(56) References Cited

U.S. PATENT DOCUMENTS 10,561,049 B2  2/2020  Saab et al.
10,629,366 B2  4/2020  Lee et al.
(Continued)

FOREIGN PATENT DOCUMENTS

JP  5924964 B2   5/2016
JP  2018-093691 A  6/2018
(Continued)

OTHER PUBLICATIONS

European Search Report dated Sep. 1, 2022.
(Continued)

*Primary Examiner* — Suresh Memula
(74) *Attorney, Agent, or Firm* — Cha & Reiter, LLC

(57) ABSTRACT

According to certain embodiments, an electronic device comprises: a display configured to perform a scanning operation in a scanning operation frequency range; a battery; a wireless charging antenna configured to induce a current when proximate to wireless charging signal in a frequency range adjacent to the scanning operation frequency range, and wherein the induced current charges the battery; a first flexible printed circuit board disposed between the wireless charging antenna and the battery and connected to the display; a second flexible printed circuit board disposed in parallel with the first flexible printed circuit board; and at least one shielding sheet disposed between the wireless charging antenna and the first printed circuit board.

9 Claims, 10 Drawing Sheets

(51) Int. Cl.
- *H02J 50/00* (2016.01)
- *H02J 50/10* (2016.01)
- *H05K 1/02* (2006.01)
- *H05K 1/14* (2006.01)
- *H05K 5/00* (2006.01)
- *H05K 7/14* (2006.01)

(52) U.S. Cl.
CPC ......... *H05K 1/0216* (2013.01); *H05K 1/0277* (2013.01); *H05K 1/14* (2013.01); *H05K 5/0017* (2013.01); *H05K 7/1427* (2013.01)

(58) Field of Classification Search
USPC .......................................................... 320/160
See application file for complete search history.

(56) References Cited

U.S. PATENT DOCUMENTS

| | | | | |
|---|---|---|---|---|
| 11,670,963 | B2* | 6/2023 | Yun | H02J 50/80 320/108 |
| 2010/0194334 | A1 | 8/2010 | Kirby et al. | |
| 2014/0111147 | A1* | 4/2014 | Soar | H01F 38/14 320/108 |
| 2014/0197786 | A1* | 7/2014 | Aghassian | H02J 50/60 320/108 |
| 2015/0123599 | A1 | 5/2015 | Yun et al. | |
| 2016/0020634 | A1 | 1/2016 | Kanno | |
| 2016/0064814 | A1 | 3/2016 | Jang et al. | |
| 2016/0204645 | A1* | 7/2016 | Mitcheson | H02J 50/70 320/108 |
| 2017/0047791 | A1 | 2/2017 | Jang et al. | |
| 2017/0302771 | A1 | 10/2017 | Kim et al. | |
| 2018/0315534 | A1 | 11/2018 | Jang | |
| 2018/0352688 | A1 | 12/2018 | Jang et al. | |
| 2019/0067138 | A1 | 2/2019 | Lo et al. | |
| 2023/0275467 | A1* | 8/2023 | Farkas | H02J 50/10 320/108 |

FOREIGN PATENT DOCUMENTS

| | | | |
|---|---|---|---|
| KR | 10-2006-0027209 | A | 3/2006 |
| KR | 10-2014-0086363 | A | 7/2014 |
| KR | 10-2014-0117690 | A | 10/2014 |
| KR | 10-2015-0051812 | A | 5/2015 |
| KR | 10-2015-0123437 | A | 11/2015 |
| KR | 10-2016-0028384 | A | 3/2016 |
| KR | 10-2016-0140025 | A | 12/2016 |
| KR | 10-2017-0019826 | A | 2/2017 |
| KR | 10-2017-0028866 | A | 3/2017 |
| KR | 10-1724596 | B1 | 4/2017 |
| KR | 10-2018-0121135 | A | 11/2018 |
| KR | 10-2018-0130645 | A | 12/2018 |
| KR | 10-1939663 | B1 | 1/2019 |
| KR | 10-2019-0065330 | A | 6/2019 |

OTHER PUBLICATIONS

EMI Shielding and Reflection From Textile Mesh Grids Compared With Analytic Models IEEE Transactions on Electromagnetic Compatibility, vol. 61, No. 2, Apr. 2019.
Korean Office Action dated Apr. 8, 2024.
European Search Report dated Dec. 2, 2022.
Korean Notice of Final Rejection dated Dec. 20, 2024.

* cited by examiner

ELECTRONIC DEVICE HAVING WIRELESS CHARGING FUNCTION AND CONTROL METHOD THEREOF

CROSS-REFERENCE TO RELATED APPLICATION

This application is a continuation of and claims priority to PCT Application PCT/KR2020/010430 filed on Aug. 6, 2020 and published as WO 2021/025501A1 which claims priority to Korean Application Serial No. 10-2019-0095782, which was filed in the Korean Intellectual Property Office on Aug. 6, 2019, the contents of which are hereby incorporated by reference.

TECHNICAL FIELD

Certain embodiments relate to an electronic device, and more particularly, to an electronic device capable of efficiently performing functions of other functional modules simultaneously with wireless charging of the electronic device, and a method for controlling the electronic device.

BACKGROUND

Electronic devices, such as mobile phones, tablet PCs, and laptop PCs, can provide a wide variety of functions while being carried by a user. Such electronic devices may include numerous electronic components. Electronic components included in an electronic device may receive power from a battery included in the electronic device, while being portable. Due to a variety of factors, the battery consumption in electronic devices is increasing. Accordingly, an electronic device including the wireless charging antenna in addition to a wired charging scheme may be charged wirelessly, and the electronic device may be operated during wireless charging.

SUMMARY

According to certain embodiments, an electronic device comprises: a display configured to perform a scanning operation in a scanning operation frequency range; a battery; a wireless charging antenna configured to induce a current when proximate to wireless charging signal in a frequency range adjacent to the scanning operation frequency range, and wherein the induced current charges the battery; a first flexible printed circuit board disposed between the wireless charging antenna and the battery and connected to the display; a second flexible printed circuit board disposed in parallel with the first flexible printed circuit board; and at least one shielding sheet disposed between the wireless charging antenna and the first printed circuit board.

According to certain embodiments, a method for controlling wireless charging of an electronic device including a display, a battery, and a wireless charging antenna configured to charge the battery, the method comprises: charging the battery according to a preset charging mode via the wireless charging antenna; identifying a state of the display; changing the charging mode when the display is in an on state; and performing charging of the battery according to the changed charging mode.

DETAILED DESCRIPTION

According to embodiments of the disclosure, it is possible to provide a structure of an electronic device capable of improving the efficiency of wireless charging of the electronic device and minimizing influence on the operation of other functional modules.

According to the method of controlling the electronic device according to the embodiments of the disclosure, it is possible to improve the efficiency of wireless charging and reducing influence on the operation of other functional modules.

Certain embodiments of the disclosure may provide a structure of an electronic device for efficiently performing the operation of other function modules simultaneously with wireless charging.

Certain embodiments of the disclosure may provide a structure of an electronic device for improving the efficiency of wireless charging and minimizing influence on the operation of other functional modules.

Certain embodiments of the disclosure may provide a structure of an electronic device and a control method thereof for improving the efficiency of wireless charging and reducing influence on the operation of other functional modules.

Certain embodiments of the disclosure may provide a structure of an electronic device for improving the efficiency of wireless charging, reducing influence on the operation of other functional modules, and reducing the thickness of the electronic device.

Figure 1:
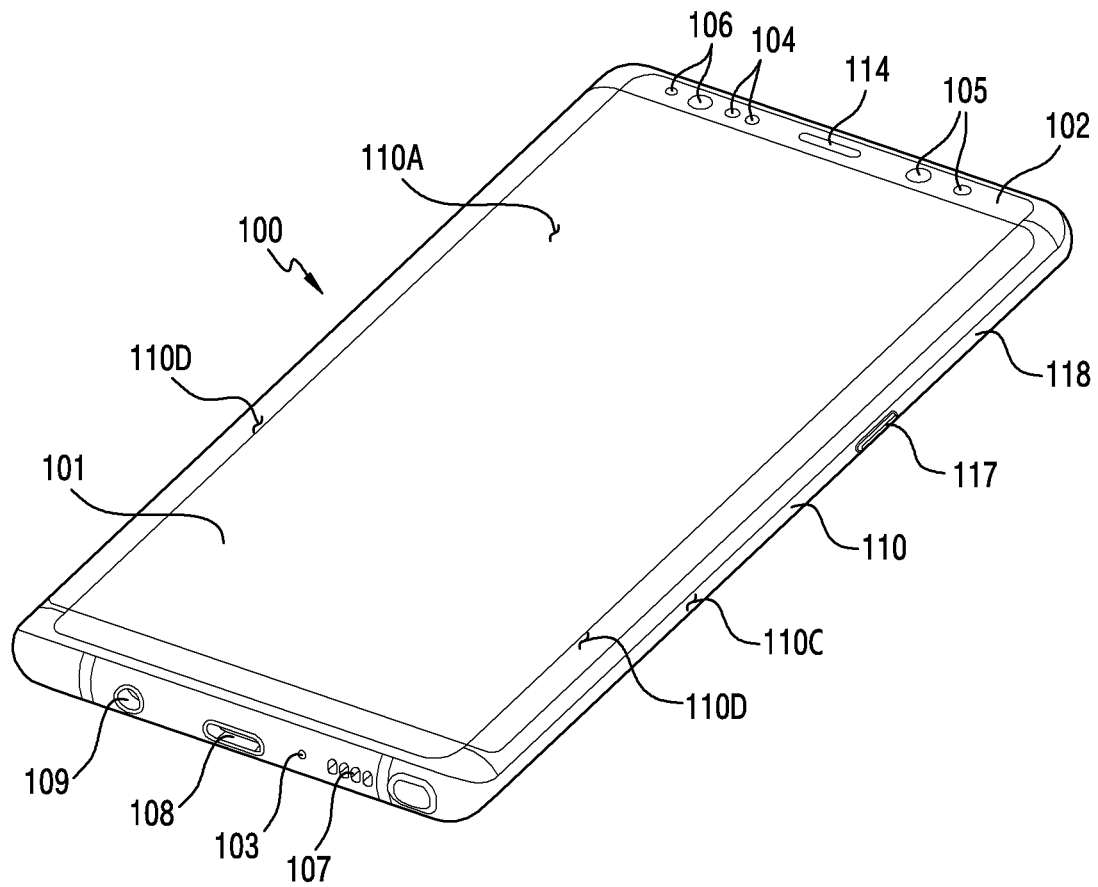
FIG. 1 is a front perspective view of an electronic device having a wireless charging function according to certain embodiments of the disclosure.
Figure 2:
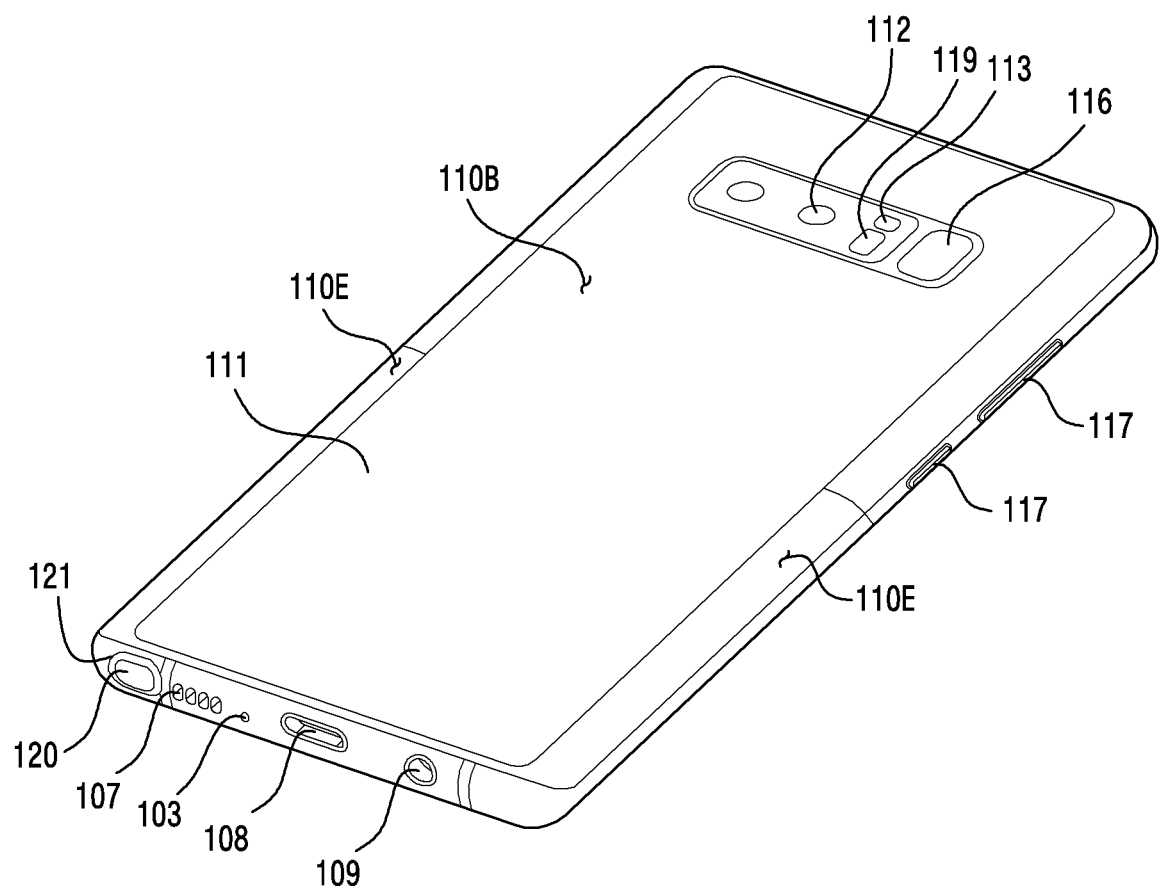
FIG. 2 is a rear perspective view of the electronic device of FIG. 1.

FIGS. 1 and 2 describe an electronic device 100 that includes electronic components that are powered by a battery. As can be seen, the electronic device 100 has the benefit of portability. The battery allows the electronic device 100 to be used without requiring connection to a power source. It is noted, however, that the battery may have only a limited supply of power. Accordingly, the battery can be charged when the power from the battery has been consumed.

Electronic Device

Referring to FIGS. 1 and 2, an electronic device 100 according to an embodiment may include a housing 110 including a first surface (or a front surface) 110A, a second surface (or a rear surface) 110B, and a side surface 110C surrounding the space between the first surface 110A and the second surface 110B. In another embodiment (not illustrated), the term "housing" may refer to a structure forming some of the first surface 110A, the second surface 110B, and the side surface 110C of FIG. 1. According to an embodiment, at least a portion of the first surface 110A may be defined by a substantially transparent front plate 102 (e.g., a glass plate or a polymer plate including various coating layers). The second surface 110B may be defined by a substantially opaque rear plate 111. The rear plate 111 may be made of, for example, coated or colored glass, ceramic, polymer, metal (e.g., aluminum, stainless steel (STS), or magnesium), or a combination of two or more of these materials. The side surface 110C may be defined by a side bezel structure 118 (or a "side member") coupled to the front plate 102 and the rear plate 111 and including a metal and/or a polymer. In some embodiments, the rear plate 111 and the side bezel structure 118 may be integrally configured, and may include the same material (e.g., a metal material such as aluminum).

In the illustrated embodiment, the front plate 102 may include two first areas 110D, which are bent from the first surface 110A toward the rear plate 111 and extend seamlessly, at the long opposite side edges thereof. In the illustrated embodiment (see FIG. 2), the rear plate 111 may include two second areas 110E, which are bent from the second surface 110B toward the front plate 102 and extend seamlessly, at the long opposite side edges thereof. In some embodiments, the front plate 102 (or the rear plate 111) may include only one of the first areas 110D (or the second areas 110E). In another embodiment, some of the first areas 110D or the second areas 110E may not be included. In the embodiments described above, when viewed from the side of the electronic device 100, the side bezel structure 118 may have a first thickness (or width) on the side surface portions that do not include the first areas 110D or the second areas 110E described above, and may have a second thickness, which is smaller than the first thickness, on the side surface portions that include the first areas 110D or the second areas 110E.

According to an embodiment, the electronic device 100 may include one or more of a display 101, audio modules 103, 107, and 114, sensor modules 104, 116, and 119, camera modules 105, 112, and 113, key input devices 117, a light-emitting element 106, a pen input device 120, and connector holes 108 and 109. In some embodiments, in the electronic device 100, at least one of the components (e.g., the key input devices 117 or the light-emitting elements 106) may be omitted, or other components may be additionally included.

The display 101 may be exposed through, for example, a considerable portion of the front plate 102. In some embodiments, at least a portion of the display 101 may be exposed through the front plate 102 defining the first surface 110A and the first areas 110D of the side surface 110C. In some embodiments, the edges of the display 101 may be configured to be substantially the same as the shape of the periphery of the front plate 102 adjacent thereto. In another embodiment (not illustrated), the distance between the outer periphery of the display 101 and the outer periphery of the front plate 102 may be substantially constant in order to enlarge the exposed area of the display 101.

In another embodiment (not illustrated), recesses or openings may be provided in a portion of a screen display area of the display 101, and at least one of an audio module 114, a sensor module 104, a camera module 105, and a light-emitting element 106, which are aligned with the recesses or the openings, may be included. In another embodiment (not illustrated), the rear surface of the screen display area of the display 101 may include at least one of an audio module 114, a sensor modules 104, a camera module 105, a fingerprint sensor 116, and a light-emitting elements 106. In another embodiment (not illustrated), the display 101 may be coupled to or disposed adjacent to a touch-sensitive circuit, a pressure sensor capable of measuring a touch intensity (pressure), and/or a digitizer configured to detect a magnetic field-type stylus pen. In some embodiments, at least some of the sensor modules 104 and 119 and/or at least some of the key input devices 117 may be disposed in the first areas 110D and/or the second areas 110E.

The audio modules 103, 107, and 114 may include a microphone hole 103 and speaker holes 107 and 114. The microphone hole 103 may include a microphone disposed therein to acquire external sound, and in some embodiments, a plurality of microphones may be disposed therein to be able to detect the direction of sound. The speaker holes 107 and 114 may include an external speaker hole 107 and a phone call receiver hole 114. In some embodiments, the speaker holes 107 and 114 and the microphone hole 103 may be implemented as a single hole, or a speaker (e.g., a piezo speaker) may be included without the speaker holes 107 and 114.

The sensor modules 104, 116, and 119 may generate electrical signals or data values corresponding to the internal operating state or the external environmental state of the electronic device 100. The sensor modules 104, 116, and 119 may include, for example, a first sensor module 104 (e.g., a proximity sensor) and/or a second sensor module (not illustrated) (e.g., a fingerprint sensor) disposed on the first surface 110A of the housing 110, and/or a third sensor module 119 (e.g., an HRM sensor) and/or a fourth sensor module 116 (e.g., a fingerprint sensor) disposed on the second surface 110B of the housing 110. The fingerprint sensor may be disposed not only on the first surface 110A of the housing 110 (e.g., the display 101), but also on the second surface 110B. The electronic device 100 may further include at least one of sensor modules (not illustrated), such as a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor 104.

The camera modules 105, 112, and 113 may include a first camera device 105 disposed on the first surface 110A of the electronic device 100 and a second camera device 112 disposed on the second surface 110B thereof, and/or a flash 113. The camera devices 105 and 112 may include one or more lenses, an image sensor, and/or an image signal processor. The flash 113 may include, for example, a light-emitting diode or a xenon lamp. In some embodiments, two or more lenses (e.g., an infrared camera lens, a wide-angle lens, and a telephoto lens) and image sensors may be disposed on one surface of the electronic device 100.

The key input devices 117 may be arranged on the side surface 110C of the housing 110. In another embodiment, the electronic device 100 may not include some or all of the above-mentioned key input devices 117, and a key input device 117, which is not included in the electronic device 300, may be implemented in another form, such as a soft key, on the display 101. In some embodiments, the key input devices may include a sensor module 116 disposed on the second surface 110B of the housing 110.

The light-emitting element 106 may be disposed, for example, on the first surface 110A of the housing 110. The light-emitting elements 106 may provide, for example, information about the state of the electronic device 100 in an optical form. In another embodiment, the light-emitting elements 106 may provide a light source that is interlocked with, for example, the operation of the camera module 105. The light-emitting elements 106 may include, for example, an LED, an IR LED, and a xenon lamp.

The connector holes 108 and 109 may include a first connector hole 108, which is capable of accommodating a connector (e.g., a USB connector) for transmitting/receiving power and/or data to/from an external electronic device, and/or a second connector hole (e.g., an earphone jack) 109, which is capable of accommodating a connector for transmitting/receiving an audio signal to/from an external electronic device.

The pen input device 120 (e.g., a stylus pen) may be guided to be inserted into or detached from the inside of the housing 110 through a hole 121 formed in a side face of the housing 110, and may include a button for facilitating the detachment. The pen input device 120 may include a separate resonance circuit therein so as to be interlocked with an electromagnetic induction panel 390 (e.g., a digitizer) included in the electronic device 100. The pen input device 120 may include an Electro-Magnetic Resonance (EMR) scheme, an Active Electrical Stylus (AES) scheme, and an Electric-Coupled Resonance (ECR) scheme.

As noted, the electronic device 101 includes numerous electronic component, such as, and not limited to display 101, audio modules 103, 107, and 114, sensor modules 104, 116, and 119, camera modules 105, 112, and 113, and a light-emitting element 106. Each of the foregoing user power. Although the power can be provided by a power source, such as a power outlet, connecting the electronic device 101 to a power outlet dramatically reduces portability. Accordingly, the electronic device 101 includes a battery (the term "battery" shall be understood to include, but not be limited to, a rechargeable battery).

The battery may store only a limited amount of power. Accordingly, when the power in the battery is dissipated, the battery can be recharged by either connecting the electronic device 101 to a power source or through wireless charging.

However, wireless charging typically uses a variable transmission frequency of 100 to 200 KHz. This frequency can interfere with the display scan signal causing a flicker phenomena. The flicker phenomena is the appearance of a horizontal stripe on the display.

Figure 3:
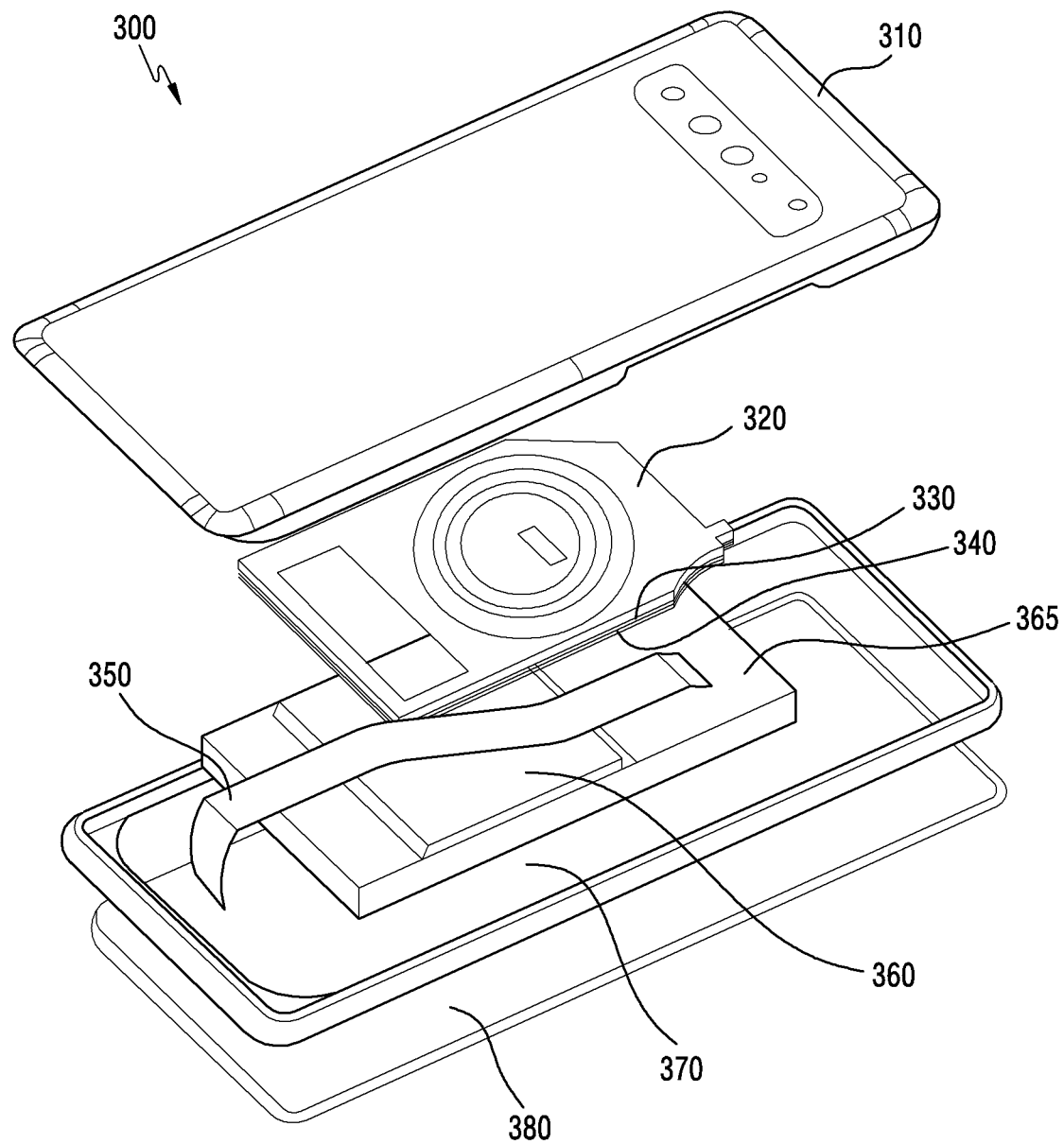
FIG. 3 is an exploded perspective view of the electronic device of FIG. 1.
Figure 4:
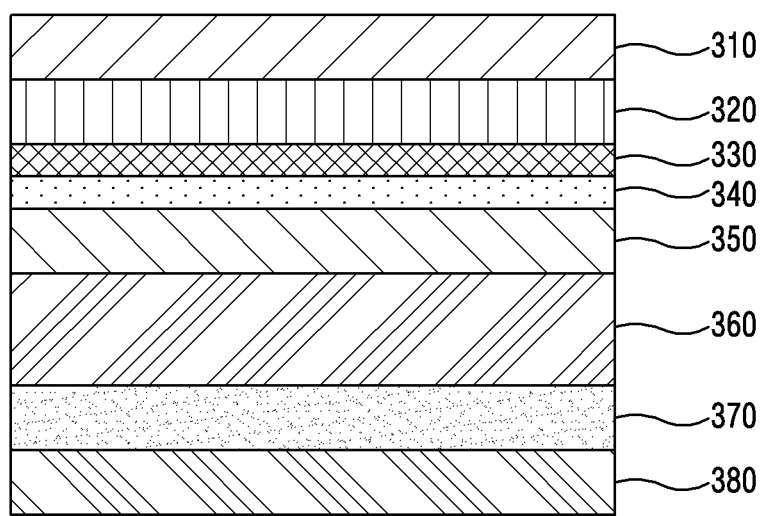
FIG. 4 is a cross-sectional view of the electronic device of FIG. 1.

FIGS. 3 and 4 disclose the interior of the electronic device 300. The electronic device includes a battery 360. The battery 360 can be charged by connection of electronic device 300 to power source, or by wireless charging. The electronic device 300 includes a wireless charging antenna 320. The wireless charging antenna 320 can include a coil. Application of an electromagnetic field to the charging antenna 320 induces a current that charges the battery 360.

Although the frequency of the electromagnetic field is in an adjacent frequency range to scanning operation frequency range for the display 380, as will be shown in FIGS. 3 and 4, the flicker phenomena is reduced if not altogether eliminated. In certain embodiments, interference with the display is prevented by disposing at least one shielding sheet between the wireless charging antenna 320 and the display 380 and the printed circuit boards of the electronic device 300.

The electronic device 300 may include a rear plate 310, a wireless charging antenna 320, at least one shielding sheet 330 and/or 340, and a flexible printed circuit board (FPCB) 350, a battery 360, a front plate 370, and a display 380. In some embodiments, the electronic device 300 may additionally include other components. At least one of the components of the electronic device 300 may be the same as or similar to at least one of the components of the electronic device 100 of FIG. 1 or 2, and a redundant description thereof will be omitted below.

Via the wireless charging antenna 320, the battery 360 may be charged using power supplied from an external power source for the electronic device 300. The wireless charging antenna 320 may be implemented in the form of a charging coil. According to an embodiment, the wireless charging antenna 320 may receive power from an external power source and charge the battery 360 according a charging method (e.g., normal charging or quick charging) selected based on at least a part of the magnitude of power (e.g., about 20 watts or more) that may be supplied from the external power source (e.g., a wireless charging adapter) or attributes of the battery 360. To this end, the electronic device 300 may be wirelessly connected to the external power source, for example, via the wireless charging antenna 320 to transmit/receive a control signal (e.g., a ping).

The shielding sheet 330 and/or 340 may block or reflect the power received from the external power source to prevent the power from being radiated to other components therearound so that the power can be efficiently transmitted to the wireless charging antenna coil of the wireless charging antenna 320.

In addition, the shielding sheet 330 and/or 340 may block an electromagnetic field or unnecessary radiated noise generated from the charging coil of the wireless charging antenna 320, thereby preventing interference with the operation of other components of the electronic device 300.

According to an embodiment, for this purpose, the shielding sheet 330 and/or 340 may be implemented to occupy at least a larger area than the area of the wireless charging antenna 320 to cover at least the entire area occupied by the wireless charging antenna 320.

According to an embodiment, the shielding sheet 330 and/or 340 may be implemented with a sufficient size to at least effectively block the wireless charging antenna 320 and the flexible circuit board 350 by covering the entire area occupied by the wireless charging antenna 320 and further covering the entire area occupied by the flexible circuit board 350. The shielding sheet 330 and/or 340 may be implemented to have the same area and shape as the sheet on which the wireless charging antenna 320 is disposed.

The shielding sheet 330 and/or 340 may be bonded to one surface of the wireless charging antenna 320 or may be configured as a separate sheet.

The shielding sheets 330 and/or 340 may be manufactured by mixing a metal and a resin so as to effectively block electromagnetic fields or unnecessary radiated noise and to be implemented as thin as possible. For example, the shielding sheet 330 and/or 340 may be implemented as a thin-film sheet in which a polyethylene terephthalate (PET) film is covered on a nano-metal structure. For example, the shielding sheet 330 and/or 340 may be implemented as a thin-film sheet after converting an amorphous metal structure into a nano-grained metal structure through a heat treatment process.

According to an embodiment, the shielding sheet 330 and/or 340 may include a first shielding sheet 330 and a second shielding sheet 340.

According to an embodiment, the first shielding sheet 330 and the second shielding sheet 340 may have different magnetic permeabilities. For example, the second shielding sheet 340 may be implemented to have a high magnetic permeability compared to the magnetic permeability of the first shielding sheet 330. For example, the first shielding sheet 330 may be implemented to have a magnetic permeability of 800 H/m or more and 2100 H/m or less with reference to a case of charging at, for example, 15 W. The second shielding sheet 340 may be implemented to have a permeability suitable for the purpose of shielding, for example, an electric field in a band of 100 to 300 kHz. For example, the second shielding sheet 340 may be implemented to have a high magnetic permeability of 2000 H/m or more.

According to an embodiment, the first shielding sheet 330 and the second shielding sheet 340 may have different structures. For example, any one of the first shielding sheet 330 and the second shielding sheet 340 may be implemented in a grid structure.

According to an embodiment, the first shielding sheet 330 and the second shielding sheet 340 may be implemented to differ from each other in constituent components. For example, the first shielding sheet 330 may be formed as a thin-film sheet in which a polyethylene terephthalate film is covered on a nano-metal structure as described above, and the second shielding sheet 340 may be implemented as a conductive thin film containing, in particular, a metal such as copper (Cu). In this case, preferably, the second shielding sheet 340 is not directly connected to a ground included in the display 380.

The flexible circuit board 350 may include a conductive line and may be disposed inside the rear plate 310 of the electronic device 300 to electrically connect the display 380 and the main printed circuit board 365 to each other. For example, one surface of the flexible circuit board 350 may be connected to the display 380, and the other surface may be connected to the main printed circuit board 365. According to an embodiment, one surface of the flexible circuit board 350 may be integrally coupled to the display 380, and the other surface may be detachably coupled to the main printed circuit board 365.

The flexible circuit board 350 may be formed of, for example, a metal material and/or a non-metal (e.g., polymer) material. The flexible circuit board 350 may be implemented in a shape having a longitudinal direction, and a conductive line may be disposed along the longitudinal direction of the flexible circuit board 350.

According to an embodiment, the flexible circuit board 350 may be interposed between the battery 360 and the wireless charging antenna 320 to make the electronic device 300 thinner.

The battery 360 is a device for supplying power to at least one component of the electronic device 300, and may include, for example, a non-rechargeable primary battery, a rechargeable secondary battery, or a fuel cell. At least a portion of the battery 360 may be disposed on substantially the same plane as, for example, the main printed circuit board 365. The battery 360 may be integrally disposed inside the electronic device 300, or may be detachably disposed on the electronic device 300.

On the main printed circuit board 365, a processor, a memory, and/or an interface may be mounted. The processor may include one or more of, for example, a central processing unit, an application processor, a graphics processor, an image signal processor, a sensor hub processor, or a communication processor.

The front plate 370 may be the same as or similar to the front plate 102 described with reference to FIG. 1.

Figure 5:
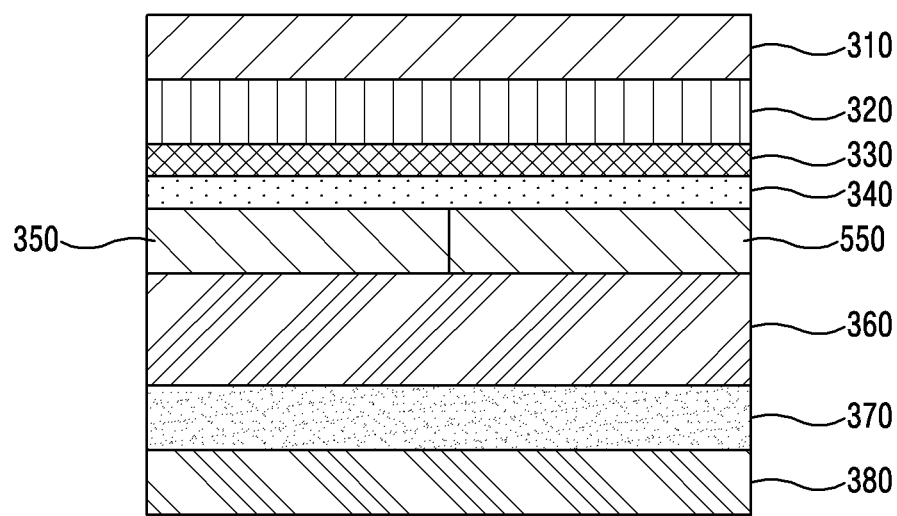
FIG. 5 is another cross-sectional view of the electronic device of FIG. 1.

Referring to FIG. 5, at least a portion of the flexible circuit board 350 (the first flexible circuit board) may be disposed on, for example, substantially the same plane as the flexible circuit board 550 (the second flexible circuit board) for USB. The USB flexible circuit board 550 may connect a USB module (not illustrated) and the main printed circuit board 365 to each other. According to an embodiment, by interposing the flexible circuit board 350 on substantially the same plane as the USB flexible circuit board 550 and between the battery 360 and the wireless charging antenna 320, it is possible to implement the electronic device 300 to have a reduced thickness, which may be advantageous for device miniaturization.

In this case, the shielding sheet 330 and/or 340 may be implemented to cover the area occupied by the wireless charging antenna 320 and to cover at least a portion of the flexible circuit board 350. In addition, the shielding sheet 330 and/or 340 may be implemented to cover the entire area occupied by the wireless charging antenna 320 and to cover all the flexible circuit board 350. Accordingly, the shielding sheet 330 and/or 340 may be implemented with a sufficient size to at least effectively block the wireless charging antenna 320 and the flexible circuit board 350.

In addition, the shielding sheet 330 and/or 340 may be implemented with a sufficient size to at least effectively block the wireless charging antenna 320 and the flexible circuit board 350 by covering the entire area occupied by the wireless charging antenna 320 and covering at least a portion of the flexible circuit board 350 or further covering the entire area occupied by the flexible circuit board 350 and the flexible circuit board 550 for USB. The shielding sheet 330 and/or 340 may be implemented to have the same area and shape as the sheet on which the wireless charging antenna 320 is disposed.

Figure 6:
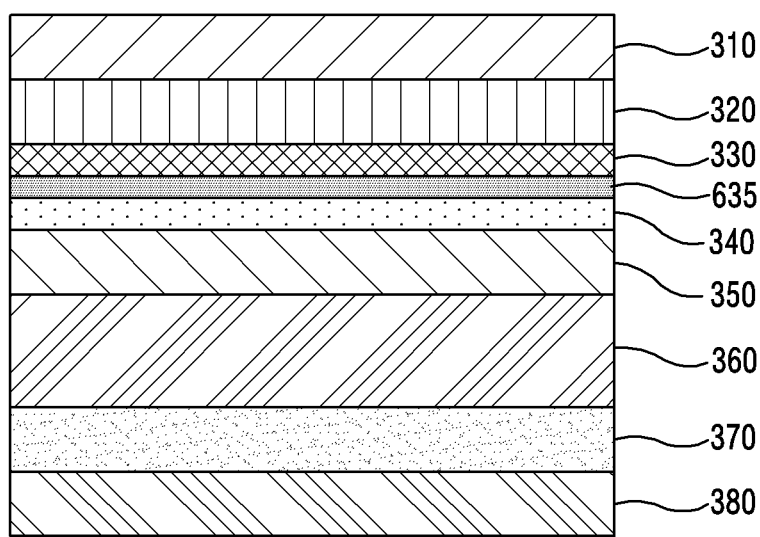
FIG. 6 is still another cross-sectional view of the electronic device of FIG. 1.

Referring to FIG. 6, the shielding sheet 330 and/or 340 may include a first shielding sheet 330 and a second shielding sheet 340. A dielectric layer 635 may be disposed between the first shielding sheet 330 and the second shielding sheet 340. The dielectric layer 635 may be implemented to have a high permittivity.

Figure 7:
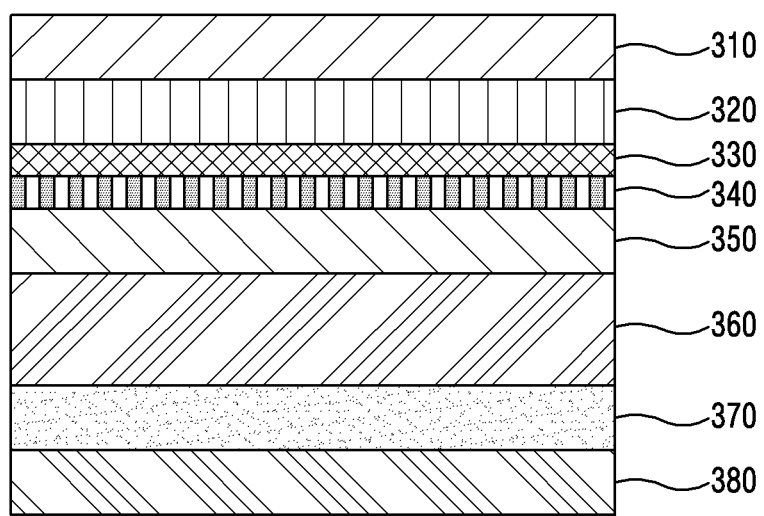
FIG. 7 is yet another cross-sectional view of the electronic device of FIG. 1.

Referring to FIG. 7, the shielding sheet 330 and/or 340 may include a first shielding sheet 330 and a second shielding sheet 340. According to an embodiment, the first shielding sheet 330 and the second shielding sheet 340 may be implemented to have different structures. For example, the second shielding sheet 340 may be implemented in a grid structure. In this case, the first shielding sheet 330 and the second shielding sheet 340 may have the same magnetic permeability. For example, the first shielding sheet 330 and the second shielding sheet 340 may be implemented to have a high magnetic permeability of 2000 H/m or less based with reference to the case of charging at, for example, 15 W.

According to an embodiment, the first shielding sheet 330 and the second shielding sheet 340 may be implemented to have the same constituent components. For example, the first shielding sheet 330 and the second shielding sheet 340 may be formed as a thin-film sheet in which a polyethylene terephthalate film is covered on a nano-metal structure as described above. In this case, the first shielding sheet 330 and the second shielding sheet 340 may be simultaneously manufactured in the same process. Alternatively, the grid structure of the second shielding sheet 340 may be manufactured by adhering to the first shielding sheet 330.

Figure 8:
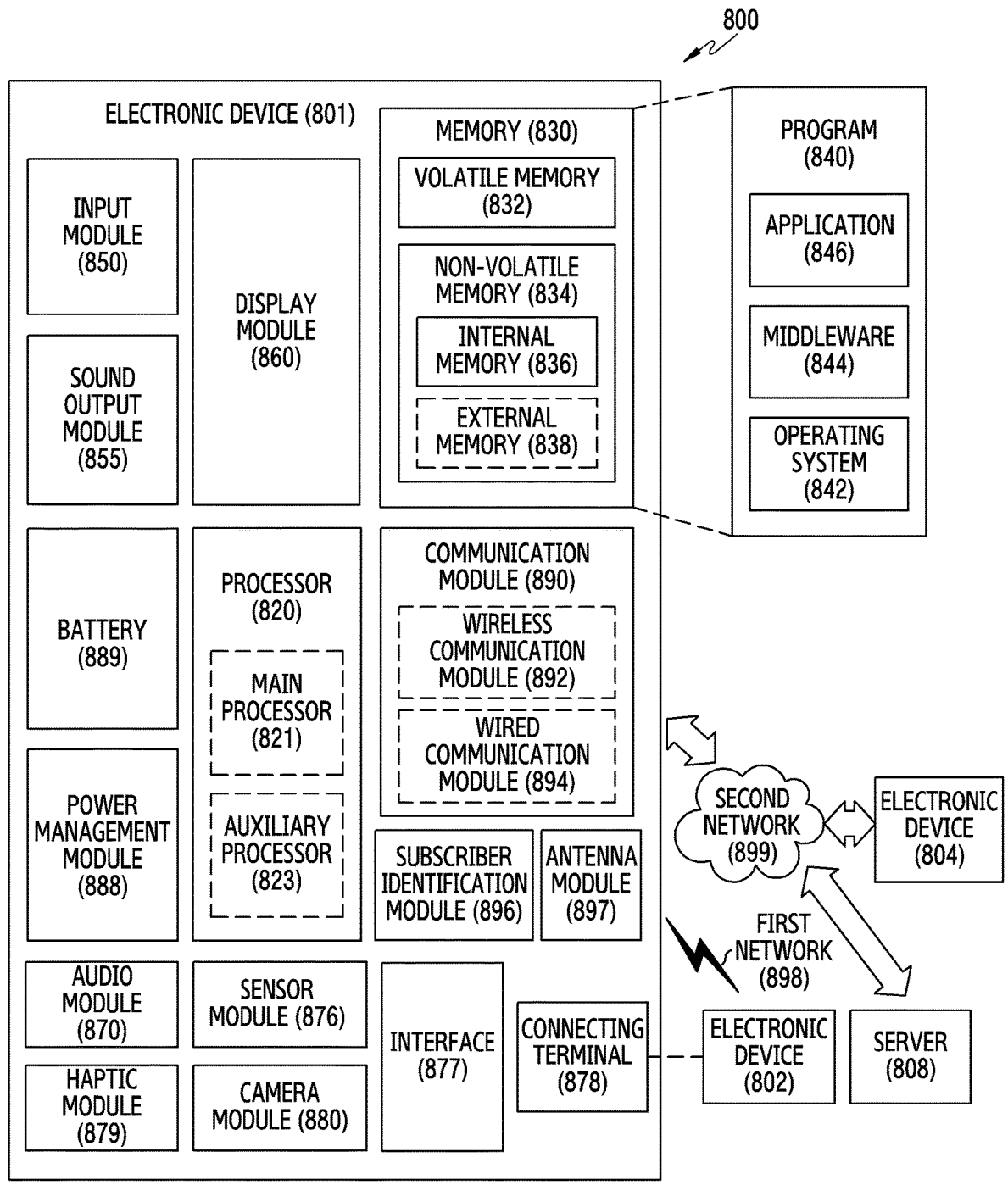
FIG. 8 is a block diagram illustrating an electronic device according to certain embodiments of the disclosure within a network environment.

FIG. 8 is a block diagram illustrating an electronic device 801 in a network environment 800 according to certain embodiments. Referring to FIG. 8, the electronic device 801 in the network environment 800 may communicate with an electronic device 802 via a first network 898 (e.g., a short-range wireless communication network), or an electronic device 804 or a server 808 via a second network 899 (e.g., a long-range wireless communication network). According to an embodiment, the electronic device 801 may communicate with the electronic device 804 via the server 808. According to an embodiment, the electronic device 801 may include a processor 820, memory 830, an input device 850, a sound output device 855, a display device 860, an audio module 870, a sensor module 876, an interface 877, a haptic module 879, a camera module 880, a power management module 888, a battery 889, a communication module 890, a subscriber identification module (SIM) 896, or an antenna module 897. In some embodiments, at least one (e.g., the display device 860 or the camera module 880) of the components may be omitted from the electronic device 801, or one or more other components may be added in the electronic device 801. In some embodiments, some of the components may be implemented as single integrated circuitry. For example, the sensor module 876 (e.g., a fingerprint sensor, an iris sensor, or an illuminance sensor) may be implemented as embedded in the display device 860 (e.g., a display).

The processor 820 may execute, for example, software (e.g., a program 840) to control at least one other component (e.g., a hardware or software component) of the electronic device 801 coupled with the processor 820, and may perform various data processing or computation. According to one embodiment, as at least part of the data processing or computation, the processor 820 may load a command or data received from another component (e.g., the sensor module 876 or the communication module 890) in volatile memory 832, process the command or the data stored in the volatile memory 832, and store resulting data in non-volatile memory 834. According to an embodiment, the processor 820 may include a main processor 821 (e.g., a central processing unit (CPU) or an application processor (AP)), and an auxiliary processor 823 (e.g., a graphics processing unit (GPU), an image signal processor (ISP), a sensor hub processor, or a communication processor (CP)) that is operable independently from, or in conjunction with, the main processor 821. Additionally or alternatively, the auxiliary processor 823 may be adapted to consume less power than the main processor 821, or to be specific to a specified function. The auxiliary processor 823 may be implemented as separate from, or as part of the main processor 821.

The auxiliary processor 823 may control at least some of functions or states related to at least one component (e.g., the display device 860, the sensor module 876, or the communication module 890) among the components of the electronic device 801, instead of the main processor 821 while the main processor 821 is in an inactive (e.g., sleep) state, or together with the main processor 821 while the main processor 821 is in an active state (e.g., executing an application). According to an embodiment, the auxiliary processor 823 (e.g., an image signal processor or a communication processor) may be implemented as part of another component (e.g., the camera module 880 or the communication module 890) functionally related to the auxiliary processor 823.

The term "processor" as used in this disclosure shall be understood to include both the singular and plural contexts.

The memory 830 may store various data used by at least one component (e.g., the processor 820 or the sensor module 876) of the electronic device 801. The various data may include, for example, software (e.g., the program 840) and input data or output data for a command related thereto. The memory 830 may include the volatile memory 832 or the non-volatile memory 834.

The program 840 may be stored in the memory 830 as software, and may include, for example, an operating system (OS) 842, middleware 844, or an application 846.

The input device 850 may receive a command or data to be used by other component (e.g., the processor 820) of the electronic device 801, from the outside (e.g., a user) of the electronic device 801. The input device 850 may include, for example, a microphone, a mouse, a keyboard, or a digital pen (e.g., a stylus pen).

The sound output device 855 may output sound signals to the outside of the electronic device 801. The sound output device 855 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 860 may visually provide information to the outside (e.g., a user) of the electronic device 801. The display device 860 may include, for example, a display, a hologram device, or a projector and control circuitry to control a corresponding one of the display, hologram device, and projector. According to an embodiment, the display device 860 may include touch circuitry adapted to detect a touch, or sensor circuitry (e.g., a pressure sensor) adapted to measure the intensity of force incurred by the touch.

The audio module 870 may convert a sound into an electrical signal and vice versa. According to an embodiment, the audio module 870 may obtain the sound via the input device 850, or output the sound via the sound output device 855 or a headphone of an external electronic device (e.g., an electronic device 802) directly (e.g., wiredly) or wirelessly coupled with the electronic device 801.

The sensor module 876 may detect an operational state (e.g., power or temperature) of the electronic device 801 or an environmental state (e.g., a state of a user) external to the electronic device 801, and then generate an electrical signal or data value corresponding to the detected state. According to an embodiment, the sensor module 876 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 877 may support one or more specified protocols to be used for the electronic device 801 to be coupled with the external electronic device (e.g., the electronic device 802) directly (e.g., wiredly) or wirelessly. According to an embodiment, the interface 877 may include, for example, a high definition multimedia interface (HDMI), a universal serial bus (USB) interface, a secure digital (SD) card interface, or an audio interface.

A connecting terminal 878 may include a connector via which the electronic device 801 may be physically connected with the external electronic device (e.g., the electronic device 802). According to an embodiment, the connecting terminal 878 may include, for example, a HDMI connector, a USB connector, a SD card connector, or an audio connector (e.g., a headphone connector).

The haptic module 879 may convert an electrical signal into a mechanical stimulus (e.g., a vibration or a movement) or electrical stimulus which may be recognized by a user via his tactile sensation or kinesthetic sensation. According to an embodiment, the haptic module 879 may include, for example, a motor, a piezoelectric element, or an electric stimulator.

The camera module 880 may capture a still image or moving images. According to an embodiment, the camera module 880 may include one or more lenses, image sensors, image signal processors, or flashes.

The power management module 888 may manage power supplied to the electronic device 801. According to one embodiment, the power management module 888 may be implemented as at least part of, for example, a power management integrated circuit (PMIC).

The battery 889 may supply power to at least one component of the electronic device 801. According to an embodiment, the battery 889 may include, for example, a primary cell which is not rechargeable, a secondary cell which is rechargeable, or a fuel cell.

The communication module 890 may support establishing a direct (e.g., wired) communication channel or a wireless communication channel between the electronic device 801 and the external electronic device (e.g., the electronic device 802, the electronic device 804, or the server 808) and performing communication via the established communication channel. The communication module 890 may include one or more communication processors that are operable independently from the processor 820 (e.g., the application processor (AP)) and supports a direct (e.g., wired) communication or a wireless communication. According to an embodiment, the communication module 890 may include a wireless communication module 892 (e.g., a cellular communication module, a short-range wireless communication module, or a global navigation satellite system (GNSS) communication module) or a wired communication module 894 (e.g., a local area network (LAN) communication module or a power line communication (PLC) module). A corresponding one of these communication modules may communicate with the external electronic device via the first network 898 (e.g., a short-range communication network, such as Bluetooth™, wireless-fidelity (Wi-Fi) direct, or infrared data association (IrDA)) or the second network 899 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 892 may identify and authenticate the electronic device 801 in a communication network, such as the first network 898 or the second network 899, using subscriber information (e.g., international mobile subscriber identity (IMSI)) stored in the subscriber identification module 896.

The antenna module 897 may transmit or receive a signal or power to or from the outside (e.g., the external electronic device) of the electronic device 801. According to an embodiment, the antenna module 897 may include an antenna including a radiating element composed of a conductive material or a conductive pattern formed in or on a substrate (e.g., PCB). According to an embodiment, the antenna module 897 may include a plurality of antennas. In such a case, at least one antenna appropriate for a communication scheme used in the communication network, such as the first network 898 or the second network 899, may be selected, for example, by the communication module 890 (e.g., the wireless communication module 892) from the plurality of antennas. The signal or the power may then be transmitted or received between the communication module 890 and the external electronic device via the selected at least one antenna. According to an embodiment, another component (e.g., a radio frequency integrated circuit (RFIC)) other than the radiating element may be additionally formed as part of the antenna module 897.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

The antenna module 897 may have a shielding sheet disposed between the antenna module 897 and the display module 860, as well as a printed circuit boards interconnecting the processor 820, and memory 830.

According to an embodiment, commands or data may be transmitted or received between the electronic device 801 and the external electronic device 804 via the server 808 coupled with the second network 899. Each of the electronic devices 802 and 804 may be a device of a same type as, or a different type, from the electronic device 801. According to an embodiment, all or some of operations to be executed at the electronic device 801 may be executed at one or more of the external electronic devices 802, 804, or 808. For example, if the electronic device 801 should perform a function or a service automatically, or in response to a request from a user or another device, the electronic device 801, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 801. The electronic device 801 may provide the outcome, with or without further processing of the outcome, as at least part of a reply to the request. To that end, a cloud computing, distributed computing, or client-server computing technology may be used, for example.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the present disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 840) including one or more instructions that are stored in a storage medium (e.g., internal memory 836 or external memory 838) that is readable by a machine (e.g., the electronic device 801). For example, a processor (e.g., the processor 820) of the machine (e.g., the electronic device 801) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

Figure 9:
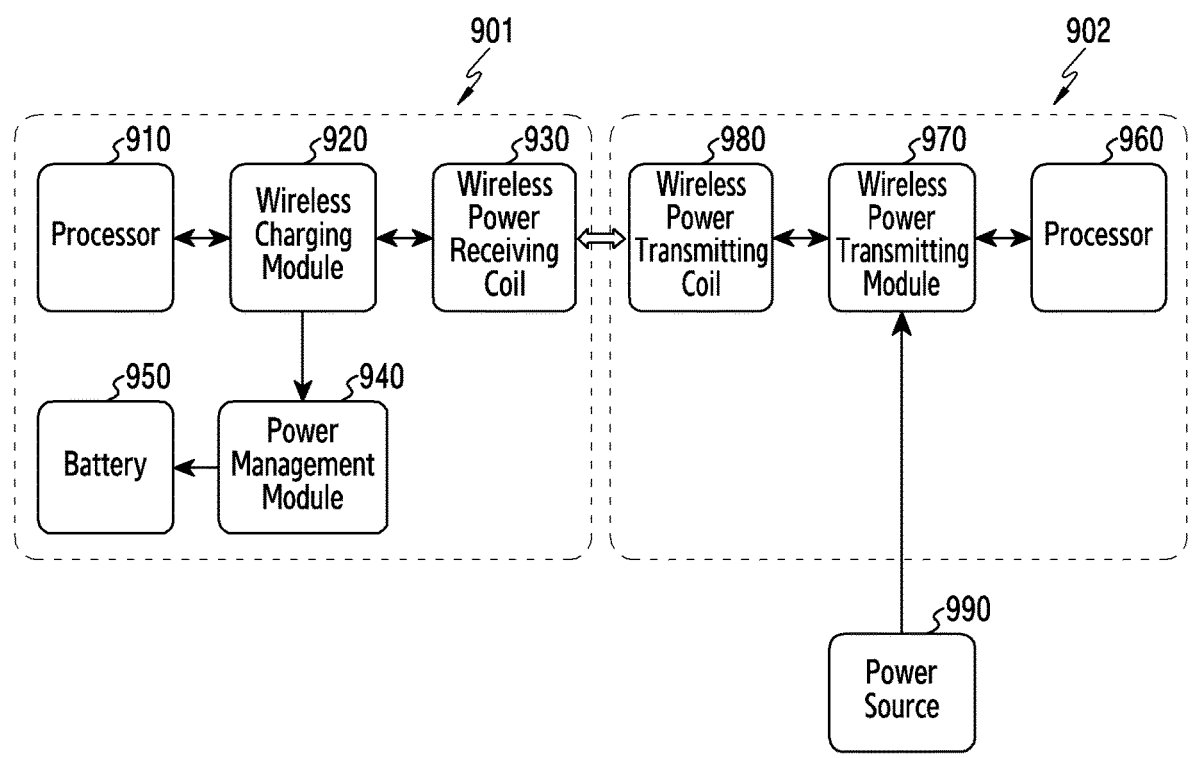
FIG. 9 is a conceptual view for describing an operation of an electronic device having a wireless charging function according to certain embodiments of the disclosure.

Referring to FIG. 9, an electronic device 901 may be connected to an external device 902 (e.g., a wireless charging adapter) to receive power from a power source 990 via the external device 902.

It is noted that the external device 902 may transmit power at frequency in the 100-200 KHz range. The frequency of the power transmission may be adjacent to the scanning operation frequency range of the display of the electronic device 901.

The electronic device 901 may include a processor 910, a wireless charging module 920, a wireless power receiving coil 930, a power management module 940, and a battery 950. The electronic device 901 may include, for example, components identical to or similar to at least some of the components of the electronic devices 100, 300, and/or 801 of FIGS. 1 to 8. The external device 902 may include a processor 960, a wireless power transmitting module 970, and a wireless power transmitting coil 980.

The processor 910 of the electronic device 901 may include, for example, the processor 820 of FIG. 8.

The wireless charging module 920 may include a wireless power receiving circuit. The wireless charging module 920 may transmit/receive a control signal to the external device 902 via the wireless power receiving coil 930 under the control of the processor 910. The processor 910 may select a charging mode (e.g., a normal charging mode or a quick charging mode) including setting data, such as charging power or charging frequency. The charging mode and setting data can be based on at least a part of a magnitude of power (e.g., about 20 watt or more) that may be supplied from an external power source or attributes of the battery 950. The processor 910 may transmit a control signal including the setting data to the external device 902 to transmit power according to the selected charging method.

In certain embodiments, the wireless charging module 920 may transmit the data via another antenna using another band of communication, such as BlueTooth, or NFC, through what is known as out-of-band communication.

The wireless charging module 940 may change the charging power and/or the charging frequency transmitted from the external device 902 according to the operating state (e.g., on/off) of a component of the electronic device (e.g., the display 101 or 380 in FIGS. 1 to 4 or the display 860 in FIG. 8).

The wireless power receiving coil 930 may include, for example, a configuration that is the same as or similar to the configuration of the wireless charging antenna 320 illustrated in FIG. 3 or FIG. 4. The wireless power receiving coil 930 performs wireless charging by generating an induced current for wireless charging. The induced current for wireless charging may be generated by a change in current of the wireless power transmitting coil 980 of the external device 902. However, as described above, the operating principle of the wireless power receiving coil 930 of the disclosure is not limited thereto, and may operate in a resonance manner. In this case, the wireless power receiving coil 930 may be implemented to have the same natural frequency as the magnetic frequency generated by the wireless power transmitting coil 980. The wireless power receiving coil 930 may be connected to the wireless charging module 920 and/or the processor 910, and may be controlled by the wireless charging module 920 and/or the processor 910.

In certain embodiments, the wireless power receiving coil 930 may have at least one shielding sheet disposed thereon to prevent interference with other electronic components of the electronic device 901.

In the foregoing, an example in which the wireless charging module 920 is implemented as a component separate from the wireless power receiving coil 930 has been described, but according to an embodiment, the wireless charging module 920 may be implemented as a single component including the wireless power receiving coil 930.

The power management module 940 may adjust the voltage level or current level of the power transmitted, for example, via the electronic device 902 and received by the wireless power receiving coil 930, and supply the power to the battery 950. For this purpose, the power management module 940 may measure the use state information of the battery 950 (e.g., the capacity, the charging/discharging frequency, the voltage, or the temperature of the battery 950). The power management module 940 may determine charging state information (e.g., life, overvoltage, undervoltage, overcurrent, overcharge, over discharge, overheat, short circuit, or swelling) associated with the charging of the battery 950 at least partially based on the measured use state information. The power management module 940 may determine whether the battery 950 is abnormal or normal at least partially based on the determined charging state information. When it is determined that the state of the battery 950 is abnormal, the power management module 940 may regulate the charging of the battery 950 (e.g., reducing the charging current or voltage, or stopping the charging).

The wireless power transmitting module 970 of the external device 902 may include a wireless power transmitting circuit.

The wireless power transmitting coil 980 may generate a change in current using power from the power source 990 and an induced current for wireless charging according to the control of the wireless power transmitting module 970 of the external device 902 and/or the processor based on a control signal received via the wireless charging module 920 of the electronic device 901. Accordingly, the wireless power receiving coil 930 of the electronic device 901 may generate the induced current for wireless charging and charge the battery 950 via the power management module 940. However, as described above, the operating principle of the wireless power transmitting coil 980 of the disclosure is not limited thereto, and may operate in a resonance manner.

The processor 960 of the external device 902 may adjust transmission voltage and/or frequency of the wireless power transmitting coil 980 based on communication with the wireless charging module 920 and/or the processor 910 of the electronic device 901.

In the foregoing, an example in which the wireless power transmitting module 970 of the external device 902 is implemented as a component separate from the wireless power transmitting coil 980 has been described, but according to an embodiment, the wireless power transmitting module 970 may be implemented as a single component including the wireless power transmitting coil 980, or the wireless power transmitting module 970 may be implemented to be included in the processor 960 to control the wireless power transmitting coil 980.

According to an embodiment, an electronic device (e.g., the electronic device 100, 300, 801, or 901 in FIGS. 1 to 9) may include a display (e.g., the display 101, 380, or 860 in FIGS. 1 to 9) configured to perform a scanning operation in a scanning operation frequency range, a battery (the battery 360 or 889 in FIGS. 3 to 8, a wireless charging antenna configured to induce a current when proximate to wireless charging signal in a frequency range adjacent to the scanning operation frequency range, and wherein the induced current charges the battery (the wireless charging antenna 320 in FIG. 3 or 4), a first flexible printed circuit board (e.g., the flexible circuit board 350 in FIGS. 3 to 7) disposed between the wireless charging antenna 320 and the battery 360, and a second flexible printed circuit board (e.g., the flexible circuit board 550 of FIG. 5) disposed in parallel to the first flexible printed circuit board 350. At least one shielding sheet (e.g., the shielding sheets 330 and/or 340 of FIGS. 3 to 7) can be between the wireless charging antenna 320 and the first and second flexible printed circuit boards 350 and 550.

The at least one shielding sheet 330 and/or 340 may include a first shielding sheet 330 having a first magnetic permeability and a second shielding sheet having a second magnetic permeability different from the first permeability.

The second shielding sheet 340 may have a higher magnetic permeability than the first shielding sheet 330.

The first shielding sheet 330 may be bonded to one surface of the wireless charging antenna 320 to increase the charging efficiency of the wireless charging antenna. The first shielding sheet 330 is configured to form a portion of the magnetic field. The second shielding sheet 340 may be bonded to one surface of the first shielding sheet 330 to block noise radiated from the wireless charging antenna 320 by electrically isolating the wireless charging antenna 320 from the other electronic component in the electronic device.

The second shielding sheet 340 may include a metal thin film containing copper (Cu). Preferably, the second shielding sheet 340 may not be directly connected to the ground included in the display 360.

The shielding sheet 330 and/or 340 may preferably cover at least an area occupied by the wireless charging antenna 320.

The wireless charging frequency range and the scan operation frequency range may overlap each other within a range of 8 kHz.

The at least one shielding sheet 330 and/or 340 may include a first shielding sheet 330 and a second shielding sheet 340, and the second shielding sheet 340 may have a grid shape.

The at least one shielding sheet 330 and/or 340 may include a first shielding sheet 330 and a second shielding sheet 340, and a dielectric layer may be interposed between the first shielding sheet 330 and the second shielding sheet 340.

In certain embodiments, the flickering phenomena can be reduced, if not eliminated by changing the charging mode when the display is on. That is, when the display is off, a wireless power signal may have a frequency that is close to the scanning operation frequency of the display. Upon detecting that the display is on, the frequency of the power signal can be changed to avoid interfering with the display.

Figure 10:
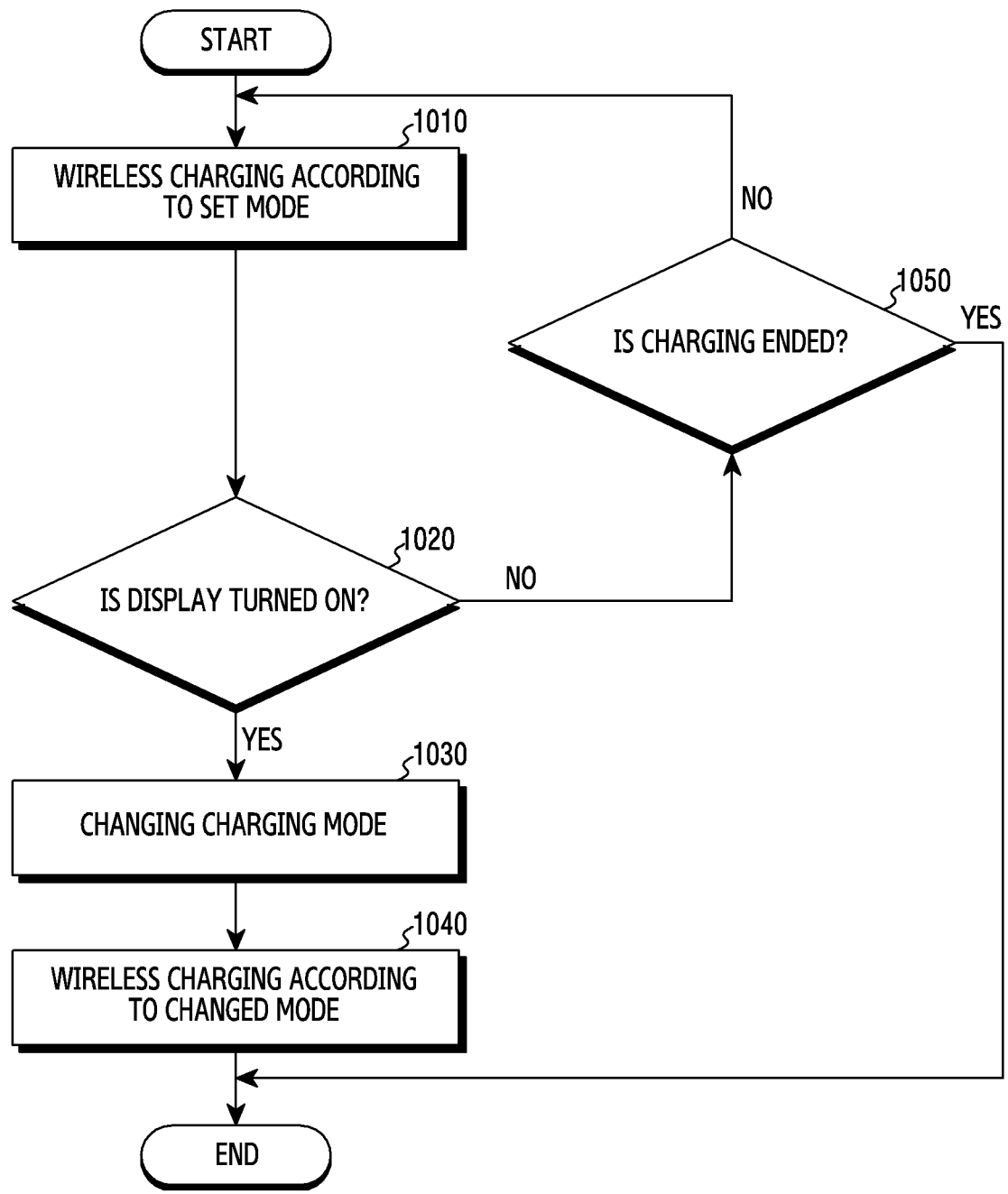
FIG. 10 is a flow chart for describing a control operation of an electronic device having a wireless charging function according to certain embodiments of the disclosure.

Referring to FIG. 10, a processor (e.g., the processor 820 or 910 in FIG. 8 or 9) of an electronic device (e.g., the electronic device 100, 300, 101, or 901 of FIGS. 1 to 9) may perform wireless charging according to a preset charging mode in operation 1010. The processor 820 or 910 may control a wireless charging module (e.g., the wireless charging module 920 in FIG. 9) and/or a wireless power receiving antenna (e.g., the wireless power receiving coil 930 in FIG. 9) to receive power from an external device (e.g., the external device 902 in FIG. 9) and to charge a battery (e.g., the battery 950 in FIG. 9) via a power management module (e.g., the power management module 940 in FIG. 9).

The charging mode may include, for example, a quick charging mode or a normal charging mode. The processor 820 or 910 may set a charging voltage, for example, in a range of 9V to 10V according to, for example, the quick charging mode, and may request the external device 902 to transmit power at a voltage of 9V to 10V via a wireless power transmission antenna (e.g., the wireless power transmitting coil 980 in FIG. 9) from the external device 902.

The charging mode may include, for example, a first charging mode or a second charging mode based on the frequency range. In the first charging mode, the frequency of the charging power may be set to, for example, a range that is the same as or similar to the scan operation frequency of the display (e.g., the display 101 or 380 of FIGS. 1 to 4 or the display device 860 of FIG. 8). The second charging mode may be a range in which the frequency of the charging power is shifted from, for example, the scan operation frequency of the display 101 or 380 to, for example, 8 kHz or more or less.

The processor 820 or 910 may set the charging frequency, for example, in the range of 110 kHz to 150 kHz according to the first charging mode, and may request the external device 902 such that the wireless power transmitting antenna 980 transmits power in a frequency within the corresponding range from the external device 902.

In operation 1020, the processor 820 or 910 may identify the state (e.g., on or off) of another component of the electronic device 100, 300, 101 or 901, for example, a display (e.g., the display 101 or 380 in FIGS. 1 to 4, or the display device 860 in FIG. 8) (e.g., whether the component is turned on or off).

When it is identified that the display 101 or 380 is turned on in operation 1020, the processor 820 or 910 may change the wireless charging mode in operation 1030 and may cause wireless charging according to the changed wireless charging mode in operation 1040. The processor 820 or 910 may change the voltage and/or frequency of power received from the external device 902 via, for example, the wireless charging module 920.

The processor 820 or 910 may change, for example, the quick charging mode to the normal charging mode, set the charging voltage to, for example, 5V to 5.5V, and request the external device 902 such that the wireless power transmission antenna 980 of the external device 902 transmits power with a voltage of 5V to 5.5V and/or changing the frequency of the power. The processor 910 can transmit the request through either through the wireless receiving coil 930 or another antenna using out-of-band communication According to an embodiment, when changing the charging mode from the quick charging mode to the normal charging mode, as shown in Table 1 below, the processor 820 or 910 may lower power by lowering the received voltage (e.g., the output voltage Rx Vout of the wireless charging module 920 in FIG. 9) to a predetermined voltage and then sequentially lowering the transmitted voltage (e.g., the output voltage Tx of the wireless power transmitting module 970 or the output voltage TA of the power source 990 in FIG. 9). Accordingly, it is possible to additionally prevent a phenomenon such as charging interruption.

TABLE 1

| | | | | | | |
|---|---|---|---|---|---|---|
| Rx V out | 10 V | 9 V | 8 V | 7 V | 6 V | 5.5 V |
| Tx voltage | 10 V | 10 V | 5.5 V | 5.5 V | 5.5 V | 5.5 V |
| TA voltage | 9 V | 9 V | 5 V | 5 V | 5 V | 5 V |

The processor 820 or 910 may change, for example, the first charging mode to the second charging mode and cause the charging frequency to be shifted from the scan operation frequency range of the display 101 or 380. The processor 820 or 910 may change the charging frequency to a range of, for example, 102 kHz or less or 158 kHz or more.

In operation 1040, the processor 820 or 910 may perform wireless charging according to the changed mode. The processor 820 or 910 may control the wireless charging module 920 to receive power of a changed voltage and/or frequency based on the charging mode changed to, for example, the normal charging mode and/or the second charging mode, and to charge the battery 950 via the power management module 940.

Meanwhile, when it is identified in operation 1020 that the display 101 or 380 is in the off state, the processor 820 or 910 may determine whether to end charging in operation 1050, and when charging is not ended, the processor 820 or 910 may cause charging to be continued according to the previously set charging mode.

According to certain embodiments, a method for controlling wireless charging of an electronic device including a display, a battery, and a wireless charging antenna configured to charge the battery, comprises: charging the battery according to a preset charging mode via the wireless charging antenna; identifying a state of the display; changing the charging mode when the display is in an on state; and performing charging of the battery according to the changed charging mode.

According to certain embodiments, the preset charging mode includes a quick charging mode.

According to certain embodiments, the changed charging mode includes a normal charging mode.

According to certain embodiments, a charging voltage in the quick charging mode is higher than in a charging voltage in the normal charging mode.

According to certain embodiments, in the preset charging mode, power is received in a frequency range that at least partially overlaps an operating frequency of the display, and in the changed charging mode, power is received in a frequency range shifted by at least a predetermined interval from the operating frequency of the display.

According to certain embodiments, charging the battery according to the preset charging mode comprises receiving wireless power at a first frequency by the wireless charging antenna from an external device.

According to certain embodiments, the battery according to the changed charging mode comprises receiving wireless power at a second frequency different from the first frequency by the wireless charging antenna from the external device.

According to certain embodiments, changing the charging mode comprises transmitting a request to external device to change the preset charging mode to the changed charging mode.

According to certain embodiments, transmitting the request comprises transmitting the request by the wireless charging antenna to the external device.

According to certain embodiments, the request comprises a request to change a frequency of wireless power a first frequency to a second frequency different from the first frequency.

According to certain embodiments, the request comprises a request to change a frequency of wireless power a first frequency to a second frequency different from the first frequency.

It is apparent to one of ordinary skill in the art that the camera modules according to certain embodiments of the disclosure as described above are not limited to the above-described embodiments and those shown in the drawings, and various changes, modifications, or alterations may be made thereto without departing from the disclosure.

What is claimed is:

1. An electronic device comprising:
 a display configured to perform a scanning operation in a scanning operation frequency range;
 a battery;
 a wireless charging antenna configured to induce a current when proximate to wireless charging signal in a frequency range adjacent to the scanning operation frequency range, and wherein the induced current charges the battery;
 a first flexible printed circuit board disposed between the wireless charging antenna and the battery and connected to the display;
 a second flexible printed circuit board disposed in parallel with the first flexible printed circuit board; and
 at least one shielding sheet disposed between the wireless charging antenna and the first printed circuit board.

2. The electronic device of claim 1, wherein the at least one shielding sheet includes a first shielding sheet having a first magnetic permeability and a second shielding sheet having a second magnetic permeability different from the first permeability.

3. The electronic device of claim 2, wherein the second magnetic permeability is higher than the first magnetic permeability.

4. The electronic device of claim 2, wherein the first shielding sheet is bonded to one surface of the wireless charging antenna, and the second shielding sheet is bonded to one surface of the first shielding sheet, and electrically isolates the wireless charging antenna from the display and the first flexible printed circuit board.

5. The electronic device of claim 2, wherein the second shielding sheet includes a metal film containing copper (Cu), and
 the second shielding sheet is not directly connected to a ground included in the display.

6. The electronic device of claim 1, wherein the at least one shielding sheet covers at least an area occupied by the wireless charging antenna.

7. The electronic device of claim 1, wherein the wireless charging frequency range and the scanning operating frequency range overlap each other within a range of 8 kHz.

8. The electronic device of claim 1, wherein the at least one shielding sheet includes a first shielding sheet and a second shielding sheet, wherein the second shielding sheet has a grid shape.

9. The electronic device of claim 1, wherein the at least one shielding sheet includes a first shielding sheet and a second shielding sheet, and a dielectric layer is interposed between the first shielding sheet and the second shielding sheet.

* * * * *